United States Patent [19]

Shank et al.

[11] Patent Number: 5,212,485
[45] Date of Patent: May 18, 1993

[54] ANALOG OSCILLOSCOPE DIGITIZER

[75] Inventors: Gordon W. Shank, Portland; Henry G. Fox, Sherwood; Kevin A. Robertson, Vernonia, all of Oreg.

[73] Assignee: Tektronix, Inc., Wilsonville, Oreg.

[21] Appl. No.: 589,155

[22] Filed: Sep. 27, 1990

[51] Int. Cl.$^5$ .......................................... H03M 1/00
[52] U.S. Cl. ............................... 341/161; 324/121 R; 315/364; 364/487
[58] Field of Search ............... 341/132, 137, 161, 162, 341/163, 164, 165, 169; 324/102, 121 R; 315/364, 367; 364/487

[56] References Cited

U.S. PATENT DOCUMENTS

| | | | |
|---|---|---|---|
| 2,591,738 | 4/1952 | Spencer | 324/121 R |
| 3,621,325 | 11/1971 | Moffitt | |
| 3,857,059 | 12/1974 | Larson | 315/391 |
| 3,909,671 | 9/1975 | Nakaya | 315/395 |
| 4,143,365 | 3/1979 | Cayzac et al. | 341/122 |
| 4,217,524 | 8/1980 | Kinder et al. | 315/364 |
| 4,225,940 | 9/1980 | Moriyasu et al. | 315/367 |
| 4,283,713 | 8/1981 | Philipp | 315/367 |
| 4,528,591 | 7/1985 | Liepe et al. | 341/164 |
| 4,578,667 | 3/1986 | Hollister | 341/122 |
| 4,654,584 | 3/1987 | Gyles | 324/76 R |
| 4,713,771 | 12/1987 | Crop | 364/487 |
| 4,843,307 | 6/1989 | Ichijyo | 324/121 R |
| 4,868,465 | 9/1989 | Stevens et al. | 324/121 R |
| 4,876,655 | 10/1989 | Carlton et al. | 364/487 |
| 4,985,844 | 1/1991 | Foley et al. | 364/487 |

FOREIGN PATENT DOCUMENTS 0024787 11/1981 European Pat. Off. .

Primary Examiner—Howard L. Williams
Attorney, Agent, or Firm—Francis I. Gray; Boulden G. Griffith

[57] ABSTRACT

An apparatus and method for digitizing a repetitive waveform using an analog oscilloscope uses a successive approximation technique. For each sample point on the repetitive waveform a digitizing level is compared with the repetitive waveform at that sample point, and the digitizing level is adjusted until it essentially equals the magnitude of the repetitive waveform at that point. The particular sample point is determined by comparing a delay level with a ramp signal that starts from an initial fixed trigger point on the repetitive waveform. Each point is digitized in this manner in one of three modes. The first mode samples the same point on successive iterations of the waveform until that point is digitized, and then the next point is digitized. The second mode samples each point once per iteration of the waveform by stepping the delay level n times during each iteration, and adjusting the digitizing level individually for each sample point until the digitization is complete. The third mode generates a fast ramp having n cycles per iteration of the waveform so that the delay level stays the same, but each sample point is sampled once each waveform iteration. Otherwise it is essentially the same as mode two. In like manner maxima and minima for segments of the waveform may be determined using a window interval rather than a sample pulse.

15 Claims, 20 Drawing Sheets

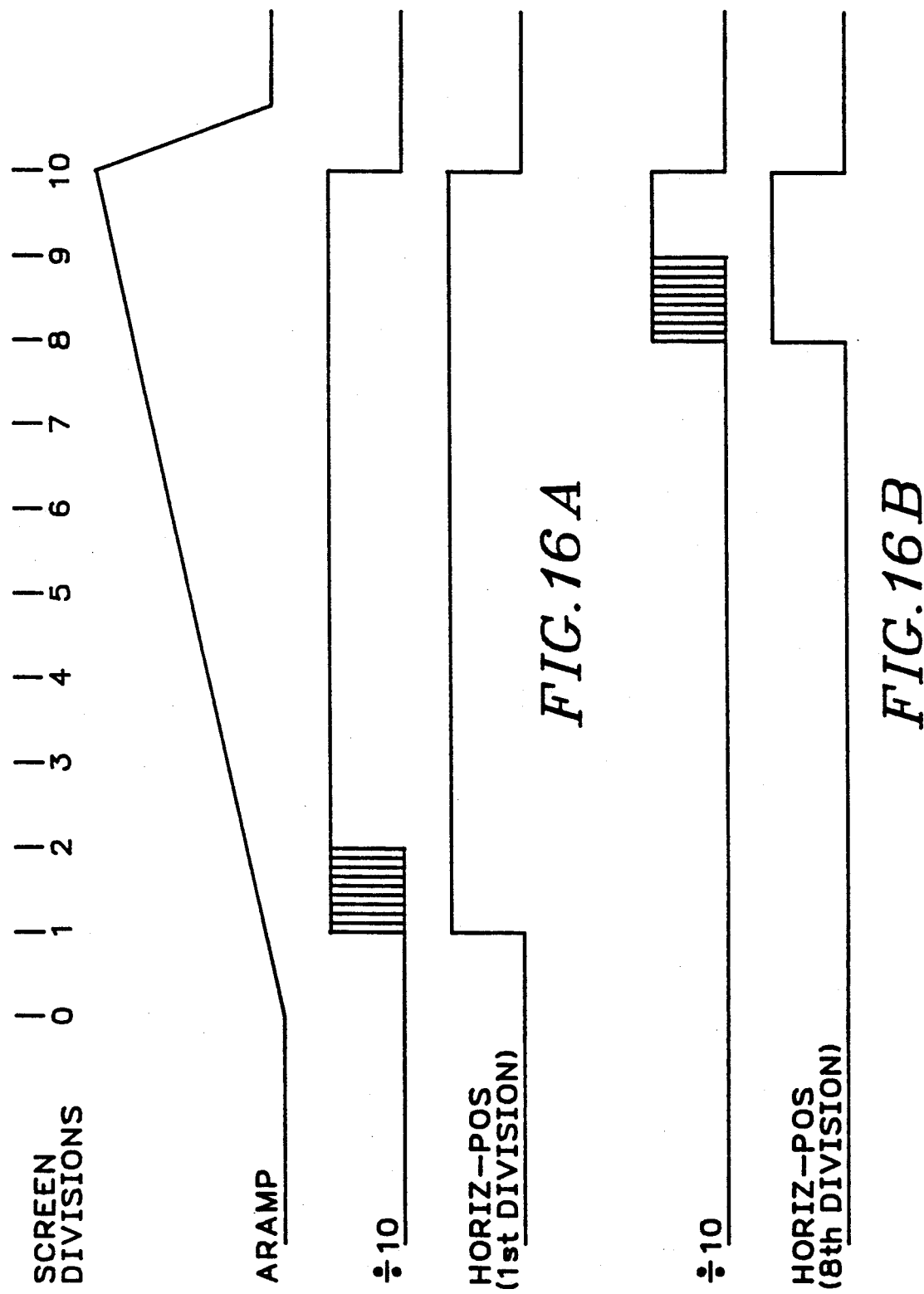

ANALOG OSCILLOSCOPE DIGITIZER

BACKGROUND OF THE INVENTION

The present invention relates to oscilloscopes, and more particularly to the use of an analog oscilloscope as a digitizer for converting a repetitive analog signal into a digital signal for storage and/or display.

Analog oscilloscopes are realtime display devices that accept an input signal and display the resulting waveform on a conventional display screen, such as the face of a cathode ray tube (CRT). The major advantage of an analog oscilloscope is that it provides a direct representation of an input signal, and updates at the fastest possible rate since only a beam retrace and trigger rearm are required between sweeps. Digital oscilloscopes on the other hand sample the input signal and convert it into a series of digital words, which digital words may be saved, processed, automatically measured, transmitted to remote locations or output at leisure in hard copy. The digital oscilloscopes sample the input signal using conventional analog-to-digital converters (ADC) that either sample in realtime, i.e., entire waveform in one pass, sample in equivalent time for a repetitive signal to effectively increase the bandwidth by taking several samples per trigger and delaying the trigger per repetition, or provide sequential sampling for repetitive signals with one sample per trigger.

What is desired is a technique using the hardware of an analog oscilloscope to perform a digitizing function on the input signal.

SUMMARY OF THE INVENTION

Accordingly the present invention provides an analog oscilloscope digitizer that compares an input repetitive signal with an initial digital level from a microprocessor, and adjusts the digital level until an essential equality at a given point on the signal is achieved. The resulting digital level is stored for that point. A time delay digital level is compared with a horizontal sweep signal to generate a strobe signal to determine the point on the repetitive analog signal to be sampled. The strobe signal indicates to the microprocessor that a sample is to be taken, and latches that sample into a flip-flop. If the analog signal is greater than the digital level, then the digital level is incremented, otherwise the digital level is decremented. The amount of increment/decrement is reduced and the process is repeated until the amount of increment/decrement is zero. The value of the digital level at that point is stored in a memory location corresponding to the point being sampled.

In the same manner a minimum and maximum value for each sample interval between sample points may be determined by generating a window over the sample interval and determining if the value of the analog signal crosses the level of the digital level during the interval, changing the digital level until such a crossover occurs.

The objects of the present invention are apparent from the following detailed description when read in conjunction with the appended claims and attached drawing.

BRIEF DESCRIPTION OF THE DRAWING

FIGS. 16A and 16B are waveform diagrams for FIG. 15.

DESCRIPTION OF THE PREFERRED EMBODIMENT

Figure 1:
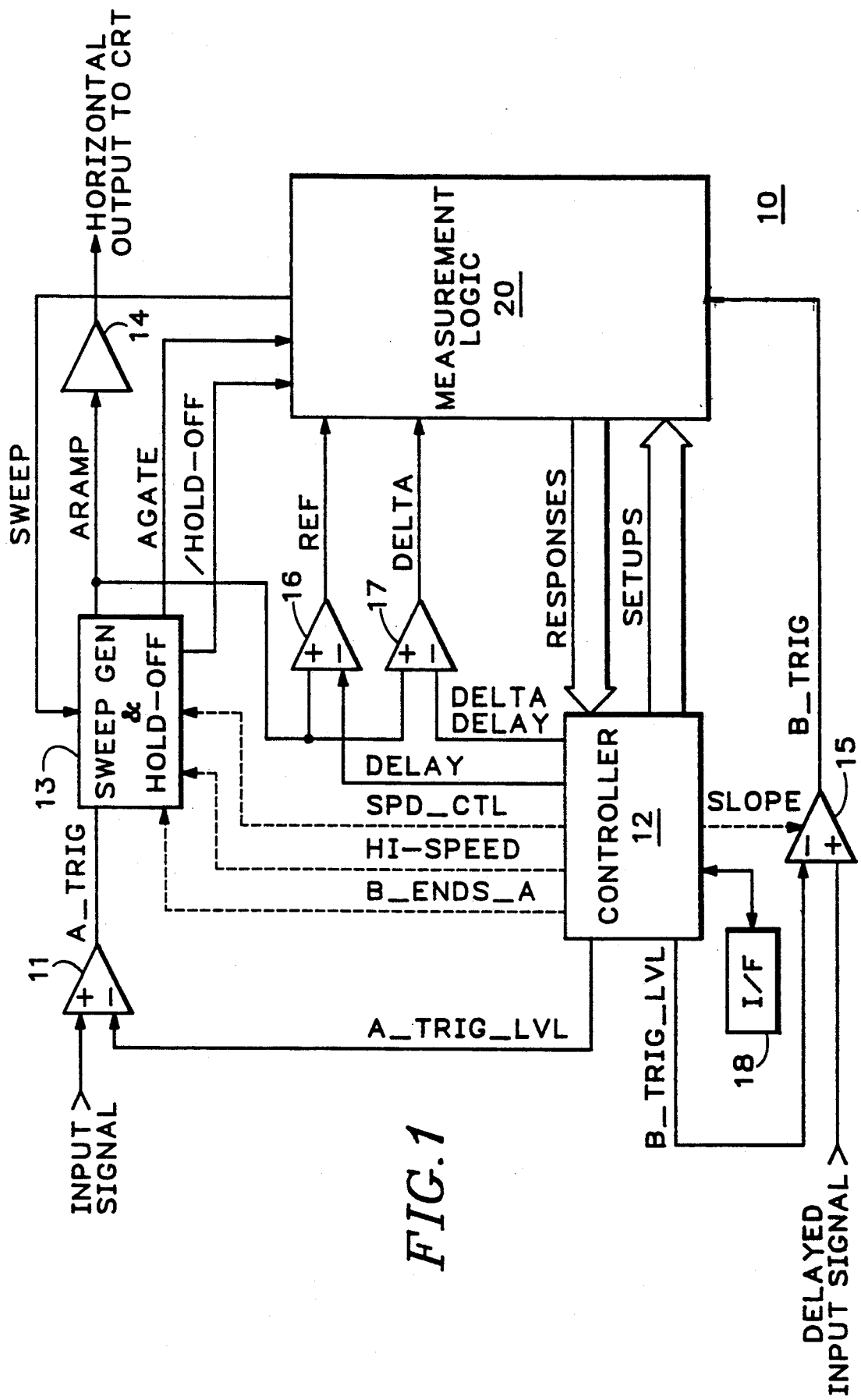
FIG. 1 is a block diagram of an analog oscilloscope digitizer according to the present invention.
Figure 2:
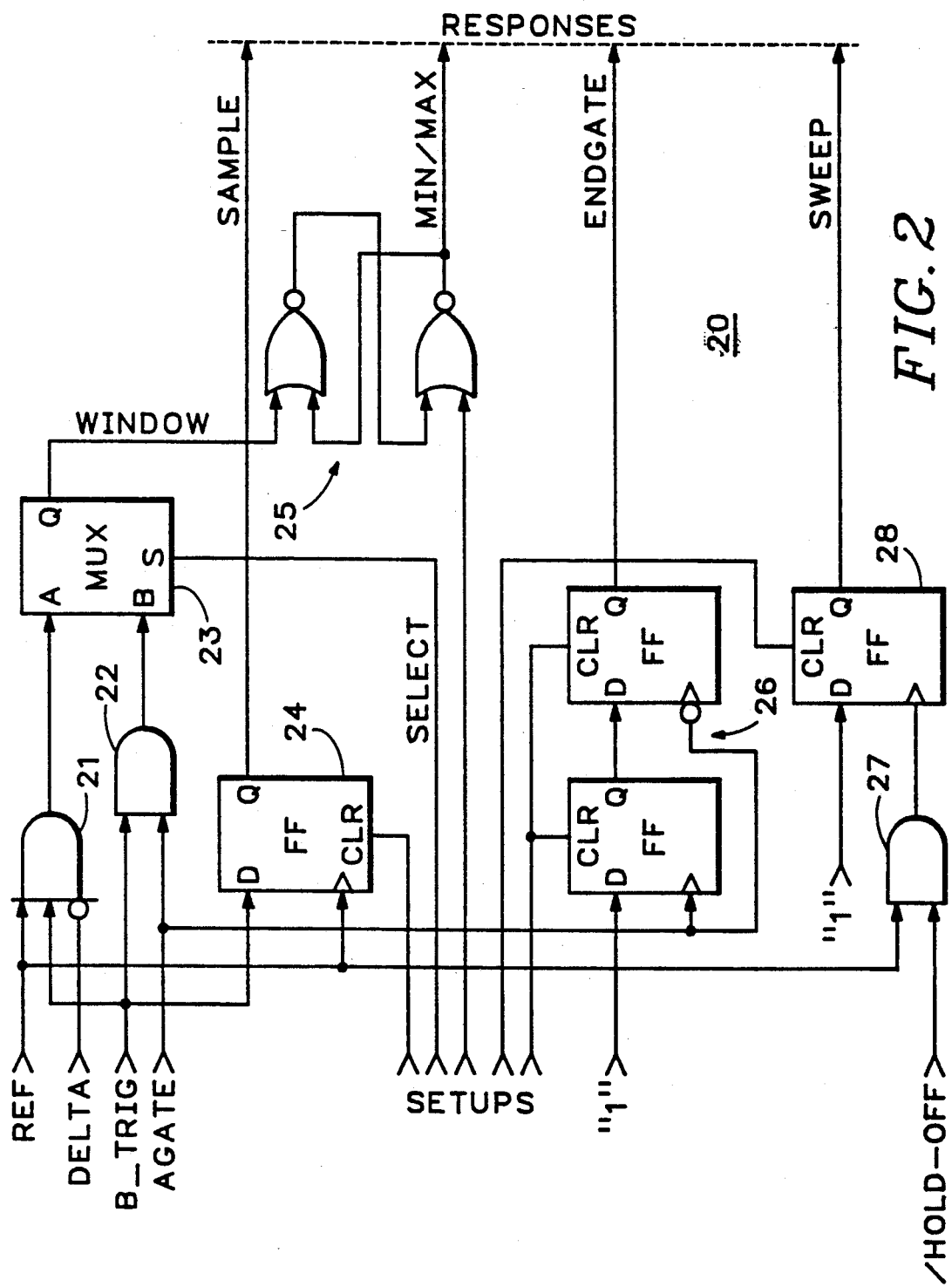
FIG. 2 is a schematic diagram of a measurement logic circuit for the block diagram of FIG. 1.

Referring now to FIGS. 1 and 2 a portion of an analog oscilloscope 10 is shown. A repetitive analog signal is input to a first trigger comparator 11 where it is compared with an A_TRIG_LVL from a microprocessor controller 12 to generate an A_TRIG signal. The A_TRIG signal is input to a sweep generator and hold-off circuit 13 that generates an ARAMP signal in the form of an analog ramp voltage and an AGATE signal having a pulse width equal to the length of the ARAMP ramp. ARAMP is input to a buffer amplifier 14 and used to drive the horizontal, or time axis, deflection of an electron beam across the face of a cathode ray tube (CRT) (not shown). A delayed version of the input signal is applied to the vertical, or amplitude axis, deflection circuit of the CRT to provide a time vs. amplitude display of the input signal, and the delayed input signal also is applied to a second trigger comparator 15 to generate a B_TRIG signal. The delayed input signal is compared to a B_TRIG_LVL signal from the controller 12 by the second trigger comparator 15 to produce the B_TRIG signal.

The ARAMP signal is applied to a first comparator 16 together with a DELAY signal from the controller 12. The ARAMP signal also is applied to a second comparator 17 together with a DELTA_DELAY signal from the controller 12. A strobe signal (REF) from the first comparator 16 is supplied to a measurement logic circuit 20. The measurement logic circuit 20 also receives the output (DELTA) of the second comparator 17 as well as the B_TRIG signal and setup signals from the controller 12. The measurement logic circuit 20 returns to the controller 12 responses determined by the inputs and a SWEEP signal to the sweep generator and hold off circuit 13.

As shown in FIG. 2 REF is applied to the clock inputs of a first, or sample, flip-flop 24 and of a second, or sweep, flip-flop 28 via an AND gate 27. Also input to the AND gate 27 is a HOLD_OFF signal from the sweep generator and hold circuit 13. The D input of the sample flip-flop 24 is coupled to the B_TRIG signal, and the D input of the sweep flip-flop 28 is coupled to a logical "1" level. The Q output from the sample flip-flop 24 provides a SAMPLE signal to the controller 12 that indicates the level of the B_TRIG signal when clocked by REF. The Q output of the sweep flip-flop 28 provides a SWEEP signal to the controller 12 when clocked by REF. The AGATE signal is applied to an ENDGATE detector 26 composed of two flip-flops in series, the first being clocked by the positive edge of AGATE and the second by the negative edge. A logical "1" is applied at the D input of the first flip-flop in the ENDGATE detector, and transferred to the second flip-flop at the end of AGATE to provide an END-GATE signal to the controller 12 from the Q output of the second flip-flop. REF and DELTA from the comparators 16, 17 are applied to opposite polarity input terminals of an AND gate 21. Also applied as an input to the AND gate 21 is the B_TRIG signal. The output of the AND gate 21 is applied as one input to a multiplexer 23. The AGATE signal and B_TRIG signal are applied as inputs to a second AND gate 22, the output of which is coupled to a second input of the multiplexer 23. The output from the multiplexer 23 is determined by a SELECT signal from the controller 12 that selects one of the AND gates 21, 22 as an output WINDOW signal. The WINDOW signal is applied to a peak latch 25 composed of two NOR gates having the output of the other NOR gate as one input. The output of the peak latch 25 provides a MIN/MAX signal to the controller 12. The controller 12 provides clear signals to the flip-flops 24, 28, to the ENDGATE detector 26, and to the latch 25. The controller 12 also provides a SLOPE signal to the second trigger comparator 15 and HI-SPEED and SPD_CTL signals to the sweep generator and hold-off circuit 13 to control the frequency of the ARAMP signal, as will be described in more detail later.

To digitize the input signal there are three digitizing modes of operation, selectable either automatically according to a selected time/div range for the display, or manually via an operator interface 18 that communicates with the controller 12. One mode of operation selects one point per horizontal sweep and repeats the selection of that point until it is digitized before moving on to digitize the next point of the input signal, i.e., it takes multiple sweeps per point to digitize the input signal so that if there are eight bits of digitization per point and 500 points to digitize for one complete horizontal display sweep, then it requires 4,000 sweeps to digitize the input signal. A second mode of operation samples each point per sweep, i.e., multiple points per sweep so that for eight bits of digitization only eight sweeps are required. The third mode of operation increases the sweep rate by the number of sample points per horizontal interval of the input signal to provide essentially the same result as that of the second mode.

Figure 3:
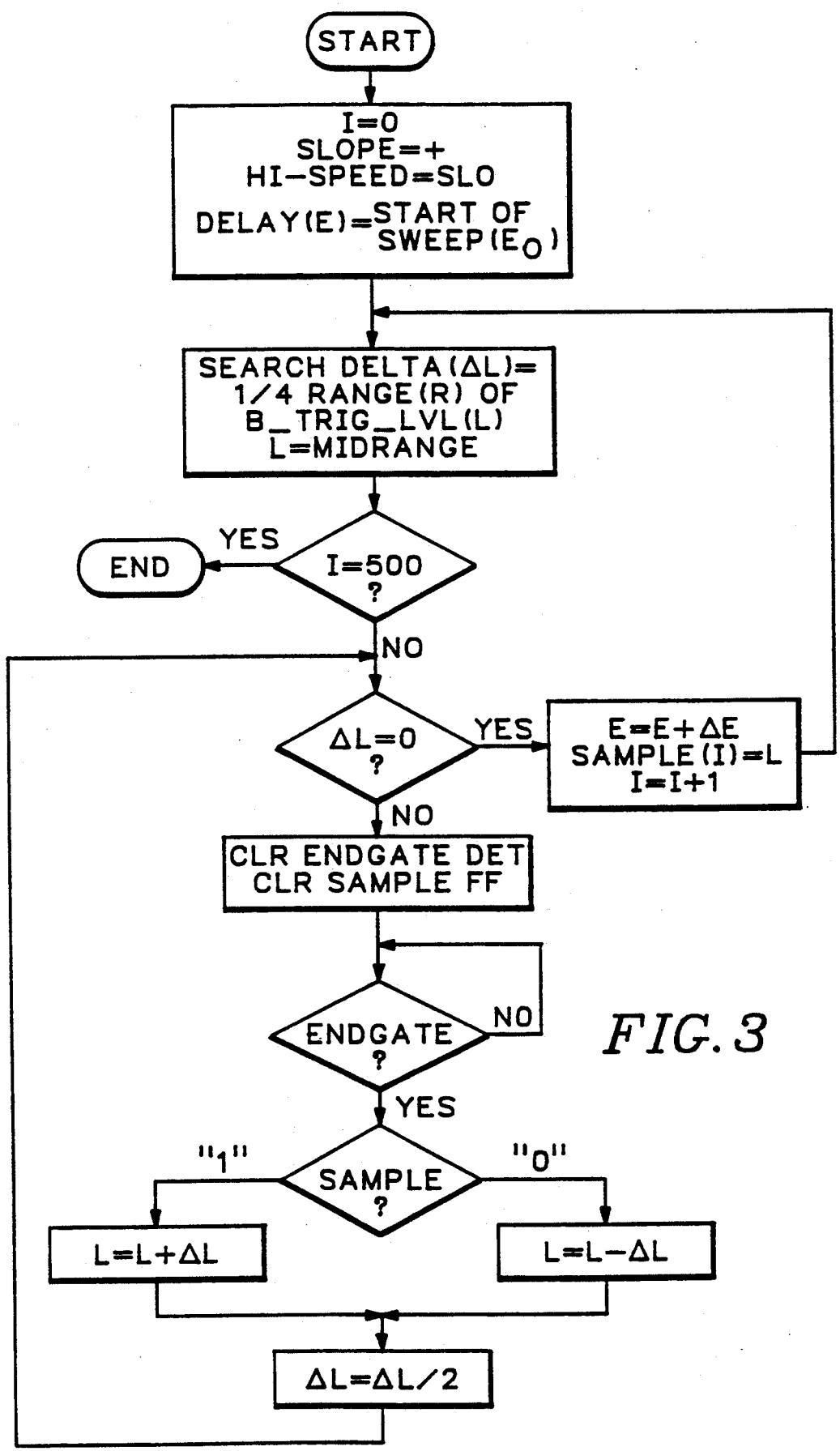
FIG. 3 is a flow chart of a first digitizing embodiment for the analog oscilloscope of FIGS. 1 and 2.

Referring now to FIG. 3 the first digitizing mode is described. At the start of digitization of a repetitive analog signal the controller 12 sets the level, E, of the DELAY signal to an initial value, $E_0$, that identifies the first point in time to be digitized. Then a delta level value, dL, is set to one-quarter of the amplitude range, R/4, for the selected vertical scale of display, and the level of the B_TRIG_LVL signal, L, is set to the middle of the range. For example if the scale varies from $-1.0$ to $+1.0$, then dL is set to 0.5 and L is set to 0.0. An index, I, is set equal to zero and represents the address for a storage memory within the controller 12 into which the corresponding point of the waveform is to be stored. The controller 12 tests the index to determine whether each point of the waveform displayed per horizontal sweep has been digitized, and if the index equals the number of available storage locations, 500 for the postulated embodiment, the digitization is complete and the program ends. Otherwise the controller 12 tests dL to see if it is equal to zero, which determines whether the digitization of the present point is completed. For the first pass through, dL=0.5 so the controller 12 clears the sample flip-flop 24 and the END-GATE detector 26. The controller 12 then waits until the ENDGATE signal indicates that the horizontal sweep determined by the ARAMP signal is complete. During the horizontal sweep REF is generated at the point determined by E. The B_TRIG signal is then latched into the sample flip-flop 24 by REF. The controller 12 increments or decrements L by dL according to the relationship of the delayed input signal at the input to the trigger comparator 15 to the B_TRIG_LVL signal, i.e., either a logical "1" or a logical "0" is sampled by the controller from the SAMPLE signal. If the output of the sample flip-flop 24 is a logical "1", then the B_TRIG_LVL signal is incremented by the delta level value, i.e., L=L+dL, otherwise the B_TRIG_LVL signal is decremented by the delta level value. dL is then divided by two by performing a right shift, and retested to determine whether it has a value of zero. This process is iterated on successive sweeps until the point is digitized. The resulting value of L is then stored in a memory location within the controller 12, SAMPLE(I), corresponding to the location of that point in time as indicated by the index.

Figure 4:
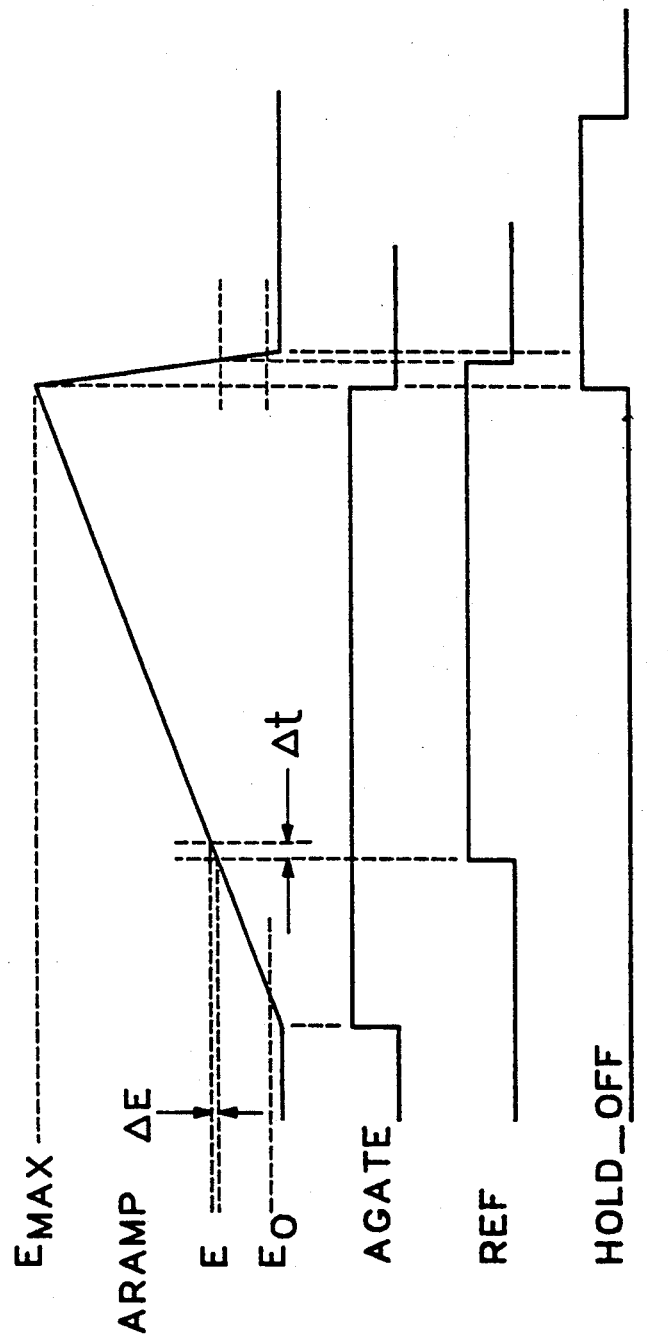
FIG. 4 is a timing diagram for the first digitizing embodiment of FIG. 3.

When the digitization of a point on the input signal is completed as determined by dL=0, then the DELAY signal is incremented by dE, equal to a sample interval along the horizontal sweep, and the index is incremented by one. The process is then repeated for the new point by setting dL=R/4 and L to midrange. The test of the index for completion is performed, and if not complete, the new point is digitized as described above. As shown in FIG. 4 ARAMP is a ramp signal that is initiated and terminated by AGATE. REF, which is output from the delay comparator 16, starts when the ramp value equals the DELAY signal value, E. Each increment, dE, equals a corresponding time increment, dt. Therefore the value of E determines which point on the input signal is being digitized. For 500 points along one horizontal sweep interval, or ramp period, there are 500 memory locations in the controller 12, and the final value of the B_TRIG_LVL signal when the digitization of a particular sample point of the input signal is complete is stored as the digitized value in the corresponding location of the memory.

Figure 5:
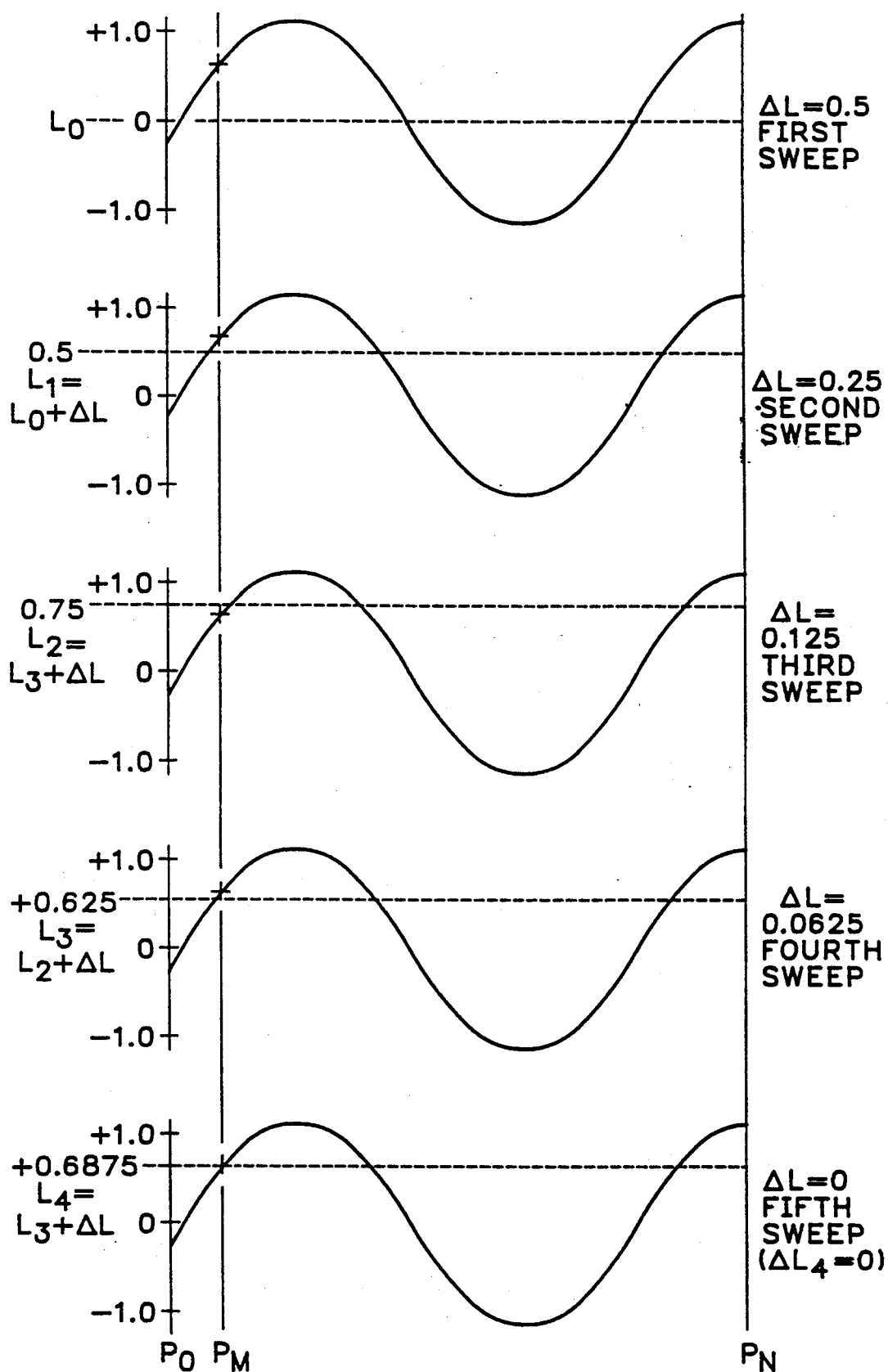
FIG. 5 is a waveform diagram illustrating the operation of the first digitizing embodiment.

FIG. 5 shows in greater detail how one data point of the input signal is digitized. At the start of the process L is set to zero and dL is 0.5. The data point of the input signal being sampled is $P_m$ which is an arbitrary point between a first point, $P_0$, and a last point, $P_n$. At the first sweep of ARAMP the value of $P_m$ is greater than L so that the output of the sample flip-flop 24 is a logical "1". For the second sweep L is incremented by dL to equal 0.5 and $P_m$ is compared again with L. Again the value of $P_m$ is greater than L, and for the third sweep L is 0.75. For this pass L is greater than the value of incremented by dL which is now 0.25 so that L is 0.75. For this pass L is greater than the value of $P_m$, so L is decremented by the value of dL, i.e., by 0.125, to produce a value of 0.625 for the fourth pass. Again the value of $P_m$ is greater than L, so that L is incremented by dL=0.0625 to produce a value for L of 0.6875. At the fifth sweep dL=0 so that the digitization of $P_m$ is complete, and the value of 0.6875 is stored in the memory at the location corresponding to $P_m$. In this manner each point between $P_0$ and $P_n$ is digitized.

Figure 6:
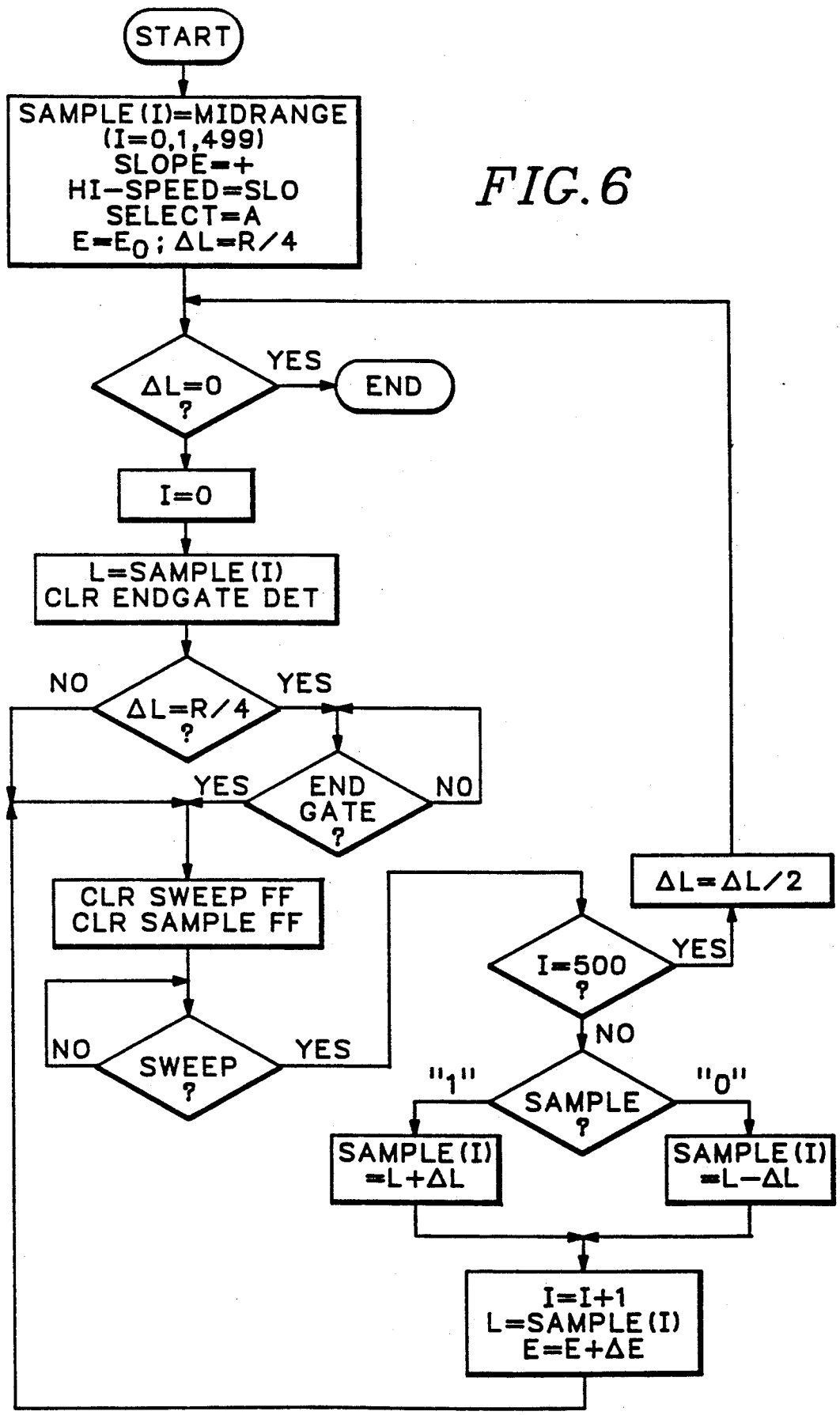
FIG. 6 is a flow chart of a second digitizing embodiment for the analog oscilloscope of FIGS. 1 and 2.

The second digitizing mode is described with reference to FIG. 6. At the start all the values of the sample points, SAMPLE(I) or P(i), stored in the memory of the controller 12 are set to a midrange value for the amplitude range selected by the operator via the interface 18. Again dL is set equal to R/4 and E is set equal to $E_0$. dL is tested to determine whether this mode is complete, and if dL=0 then every point is digitized since each point is compared for each sweep. If dL≠0, then an index, i, is set to zero for the first point, P(0), L is set equal to the value in memory of P(0), and the controller 12 clears the sample flip-flop and ENDGATE detector 24, 26. The ENDGATE detector 26 is tested to see whether the AGATE signal is completed. When the AGATE signal is completed, controller 12 clears the second flip-flop 28 and looks for the beginning of the next AGATE signal. Once the AGATE signal occurs, then the index, i, is tested to determine whether the last point for this sweep has been sampled. If i=n, where n=500 for this example, then dL is divided by two by right shifting and tested again for zero, and the process is then repeated for the next ARAMP signal. When REF causes the SWEEP signal to indicate a sample time, then the sample flip-flop 24 is tested and the value for that point, P(i), is incremented or decremented by dL. The index and DELAY signal, E, are incremented and L is set to the value of the next point, P(i+1). The controller 12 again clears the sweep flip-flop 28 and the SWEEP signal is observed for the start of the next REF signal.

Figure 7:
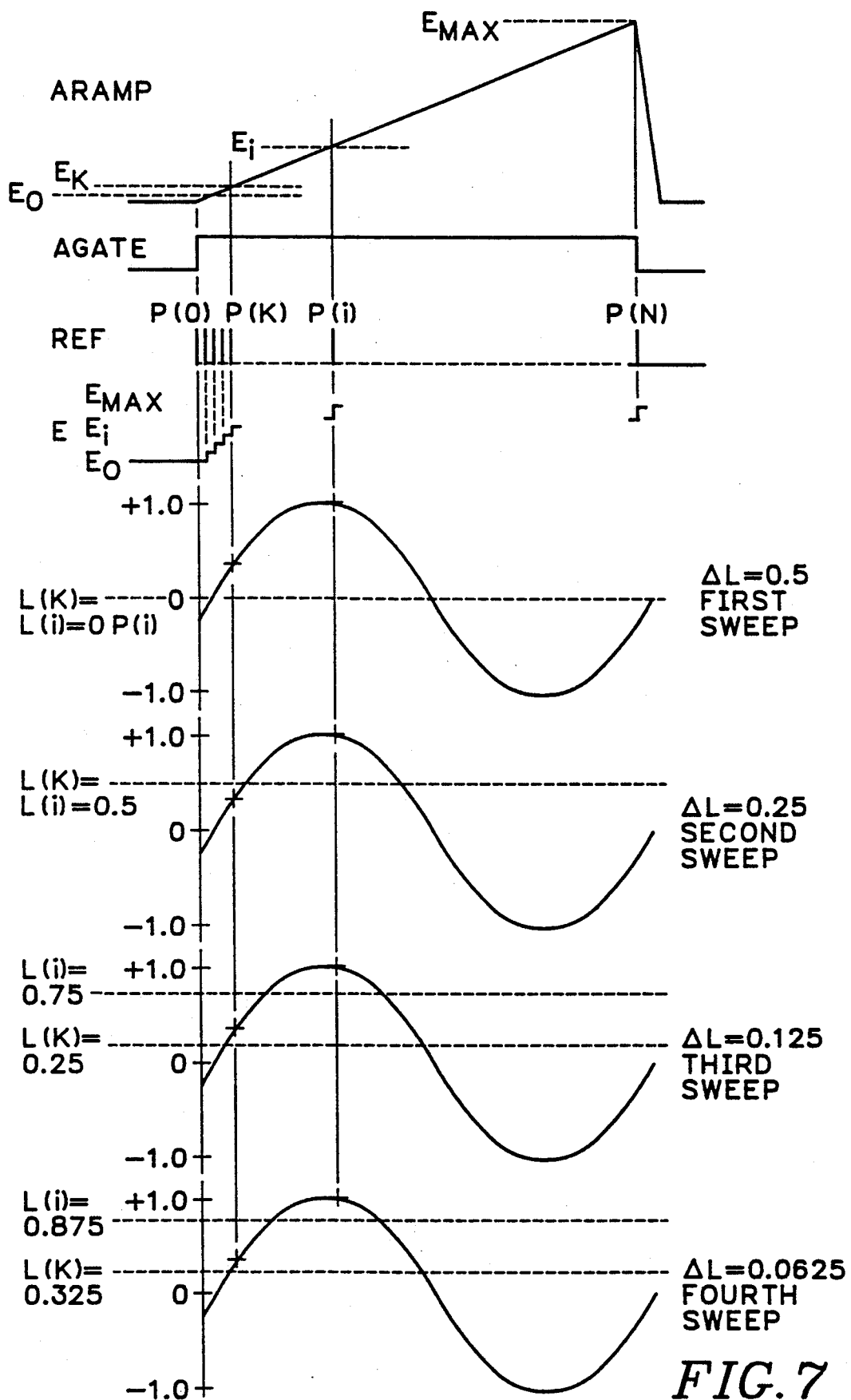
FIG. 7 is a timing diagram for the second digitizing embodiment of FIG. 5.

As shown in FIG. 7 for each ARAMP period the DELAY signal is stepped by increments of dE for each of the 500 points to be sampled during the period. For P(0) when the ramp value equals E0 REF is generated. Then E is incremented so that E is now greater than the ramp value until the next sample point is reached, when REF is again generated. Thus for each ARAMP signal period there are n REF signals where n is the number of sample points, P(i), per period. For points P(k) and P(i) at the first sweep of the ARAMP signal, L(k) and L(i) are set at the midrange value of 0.0. Since both values are above zero, on the second sweep the values of L(k) and L(i) are set equal to 0.5. For the third sweep the value of P(k) is less than the value of L(k) while the value of P(i) is greater than L(i), i.e., L(k)=0.25 while L(i)=0.75. For the fourth sweep L(k)=0.325 while L(i)=0.875. This process continues until dL=0 when the final values of L stored in the memory of the controller 12 are the digitized values for each point, P(i).

Figure 8:
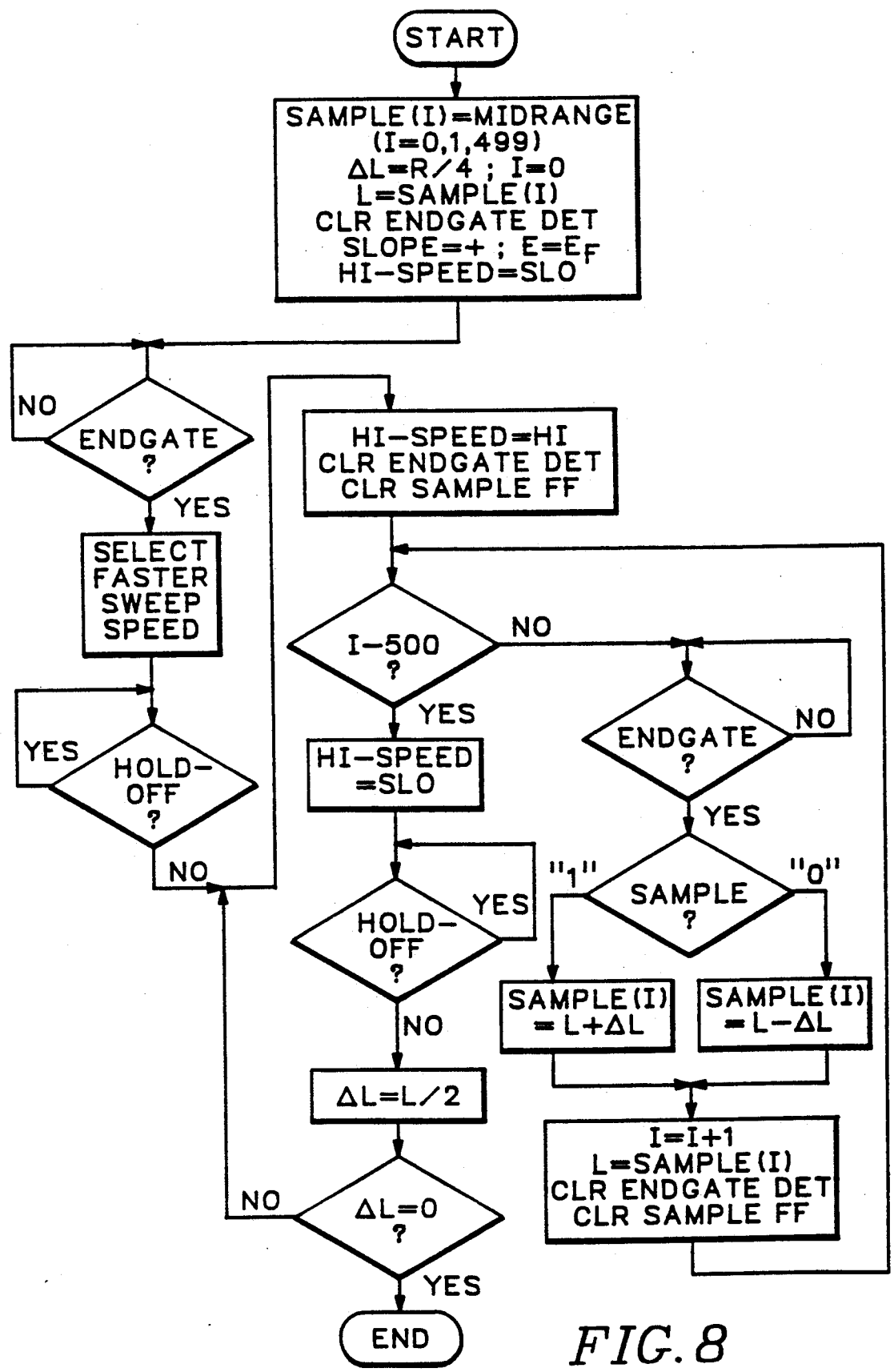
FIG. 8 is a flow chart of a third digitizing embodiment for the analog oscilloscope of FIG. 1.
Figure 9:
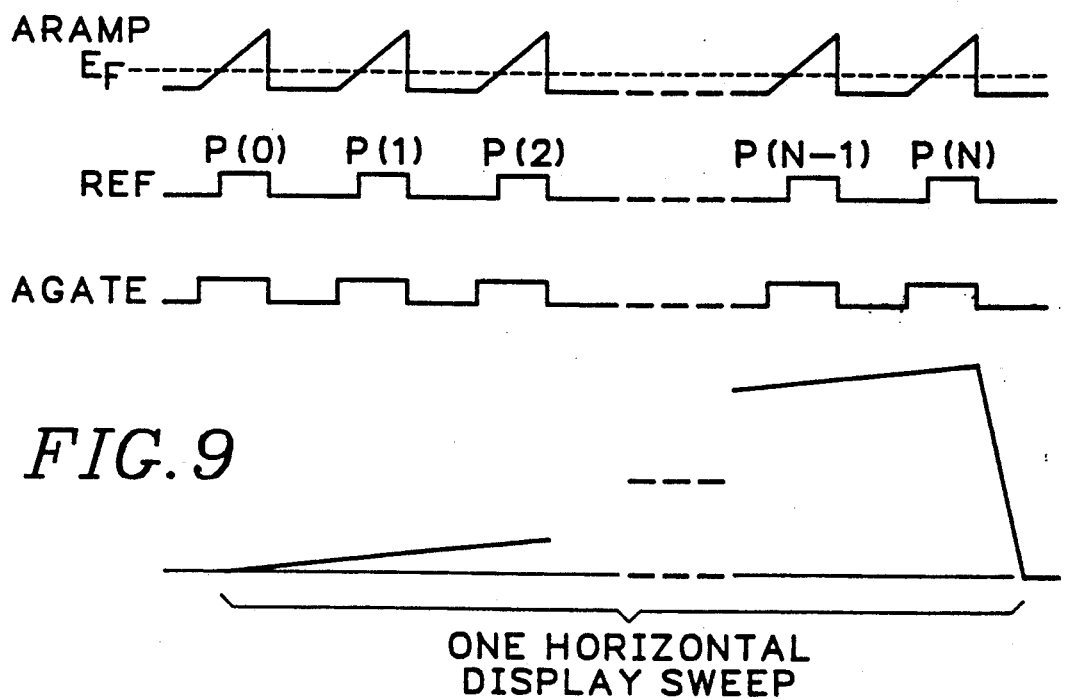
FIG. 9 is a timing diagram for the third digitizing embodiment of FIG. 7.

For the third digitization mode, as shown in FIG. 8, rather than increment the DELAY value n times per period of ARAMP, ARAMP is placed into a high speed, free-running mode by the HI-SPEED command from the controller 12 once the ARAMP signal has been triggered by A_TRIG after the prior hold-off period. This results in n ramps being generated, one for each sample point on the input signal, for a normal horizontal sweep rather than a single ramp per horizontal interval. With the first two digitization modes, since there was a single ramp per horizontal interval, the analog signal could still be viewed without interference on the CRT. However in this mode each ramp does not provide a full screen sweep and occurs at n times the sweep speed selected by the operator via the interface 18 for time per division as shown in FIG. 9, i.e., the display on the CRT is not valid. Upon entry to this third digitization mode the DELAY signal level is set at a fixed value, $E_f$, the values of P(i) in the memory are set to the midrange, L is set equal to P(O), dL is set equal to R/4 and the ENDGATE detector 26 is cleared by the controller 12. The end of a horizontal sweep is detected by the ENDGATE detector 26, the sweep speed of the sweep generator and hold-off circuit 13 is increased and the end of the hold-off period is detected. At the end of the hold-off period the ARAMP signal is switched to high speed mode, and the ENDGATE detector 26 and the sample flip-flop 24 is cleared by the controller 12. The index is tested to determine if all the sample points have been obtained, and if not then the output of the ENDGATE detector 26 is tested. When ENDGATE occurs, then the state of the SAMPLE flip-flop 24 is tested and the SAMPLE(I) value is incremented/decremented accordingly, the index is incremented, the next SAMPLE(I) value is retrieved and the ENDGATE detector 26 and SAMPLE flip-flop 24 are cleared. The program then loops back to the index test step. If all samples have been obtained, then the sweep generator and hold-off circuit 13 is commanded to the slow speed mode and the hold-off period is tested. At the end of the hold-off period dL is divided by two and, if dL=0, then the process is complete for all the points, P(i). Otherwise the process loops back to place the sweep generator and hold-off circuit 13 into the high speed mode for ARAMP, and the process repeats.

Figure 10:
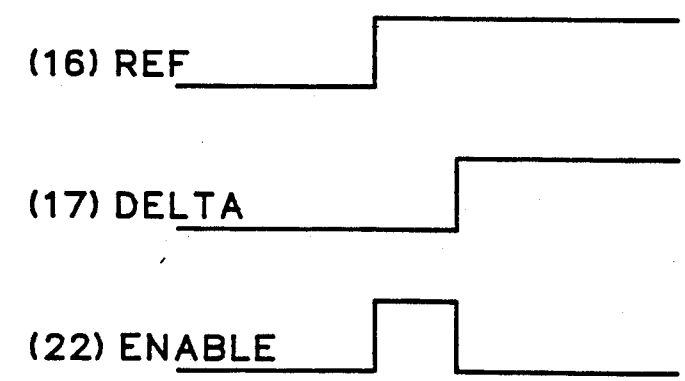
FIG. 10 is a timing diagram representing the generation of a window interval for min/max measurements according to the present invention.

The described circuitry of FIGS. 1 and 2 also may be used to obtain maximum and minimum values within sample intervals. There exists the possibility that between sample points, P(i), the input signal may not be smooth, but may have an anomaly, or may have a value greater than either sample value that defines the interval due to peaking of the signal between sample points. Obtaining minimum and maximum values within the sample intervals provides the ability to more accurately redisplay the digitized waveform from the memory. The AND gates 21, 22, the second comparator 17, the multiplexer 23 and the peak latch 25 together with the first comparator 16 and the controller 12 provide the circuitry required to perform minimum and maximum measurements. Again the minimum and maximum measurements are performed in one of three modes corresponding to the particular mode of digitization used. In operation the output of the second comparator 17 and the output of the first comparator 16 are combined by the AND gate 21 as shown in FIG. 10 to form an enable window for the AND gate. Therefore the output of the AND gate 21 represents the value of B_TRIG during the window interval. The controller 12 selects the output of the AND gate 2 from the multiplexer 23 for modes one and two where ARAMP has a period equivalent to a complete horizontal interval, and selects the output of AND gate 22 enabled by the AGATE signal when ARAMP is in the high speed mode of mode three. The WINDOW signal from the multiplexer 23 enables the peak latch 26 to be set to a logical "1" whenever B-TRIG becomes a logical "1" during the window interval specified by the enable inputs to the respective AND gates 21, 22.

Figure 11A:
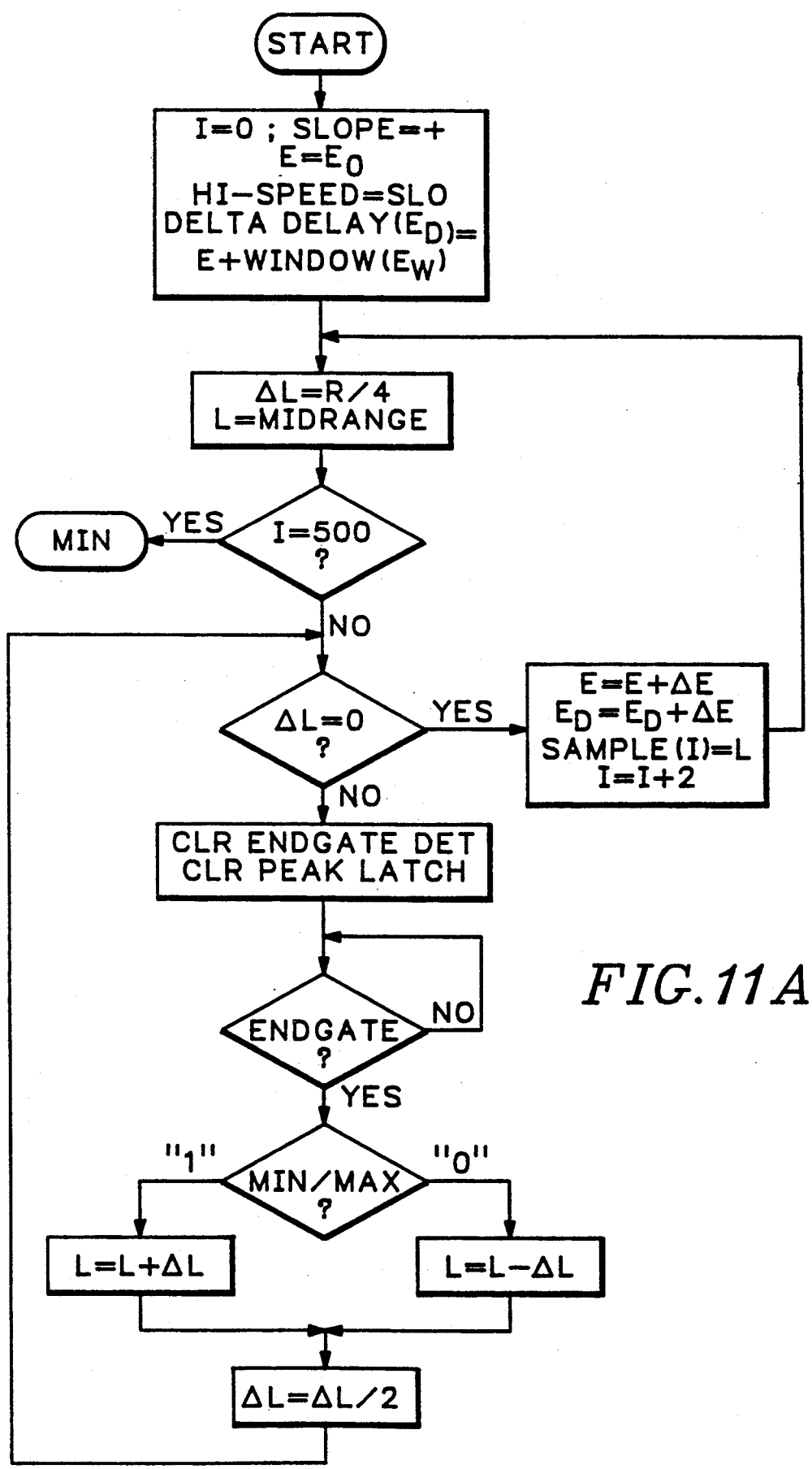
FIGS. 11A and 11B are a flow chart illustrating a first min/max measurement embodiment according to the present invention.
Figure 11B:
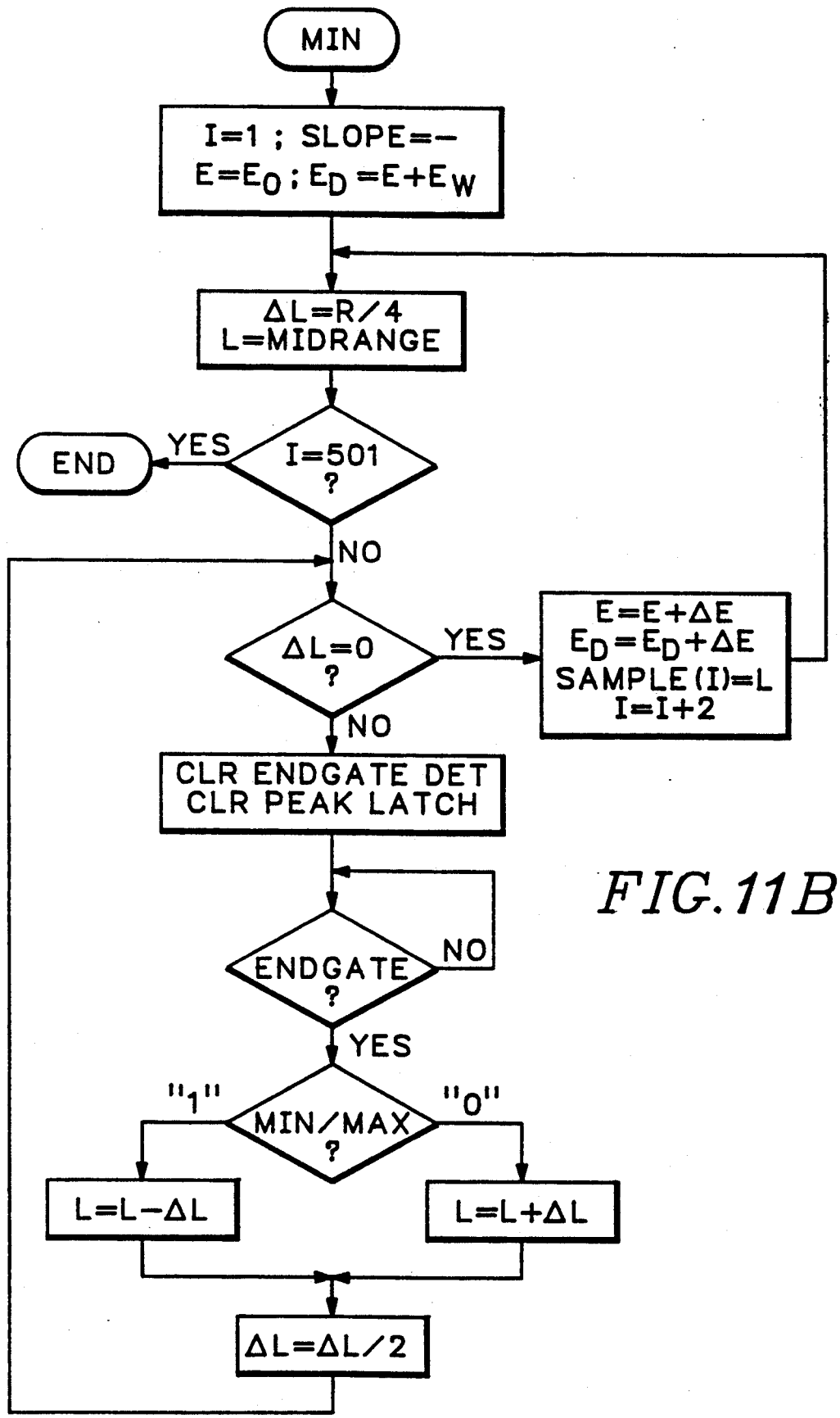

In mode one for each sweep for a particular sample point the B_TRIG_LVL signal is adjusted according to whether B_TRIG changes during the window interval for that point. As shown in FIG. 11 the process for obtaining a maximum/minimum value is similar to that for obtaining a sample value except that the output of the peak latch 25 is used by the controller 12. A DELAY DELTA, Ed, input to the second comparator 17 provides the window interval for the AND gate 21 so that rather than obtaining a point sample as in the digitizing process, an interval is examined to determine whether during that interval the delayed input signal exceeds the B_TRIG_LVL to generate a B_TRIG signal. Therefore what is stored for each time interval is the maximum value of the input signal. Once the maximum value for the point is achieved, the process is repeated to obtain a minimum value with the second trigger comparator inputs reversed by the SLOPE command from the controller 12. In this manner a minimum and a maximum value may be stored for each sample interval. Each interval is equivalent to two sample intervals so that for a given memory size one-half contains maximum values and the other one-half contains minimum values.

Figure 12A:
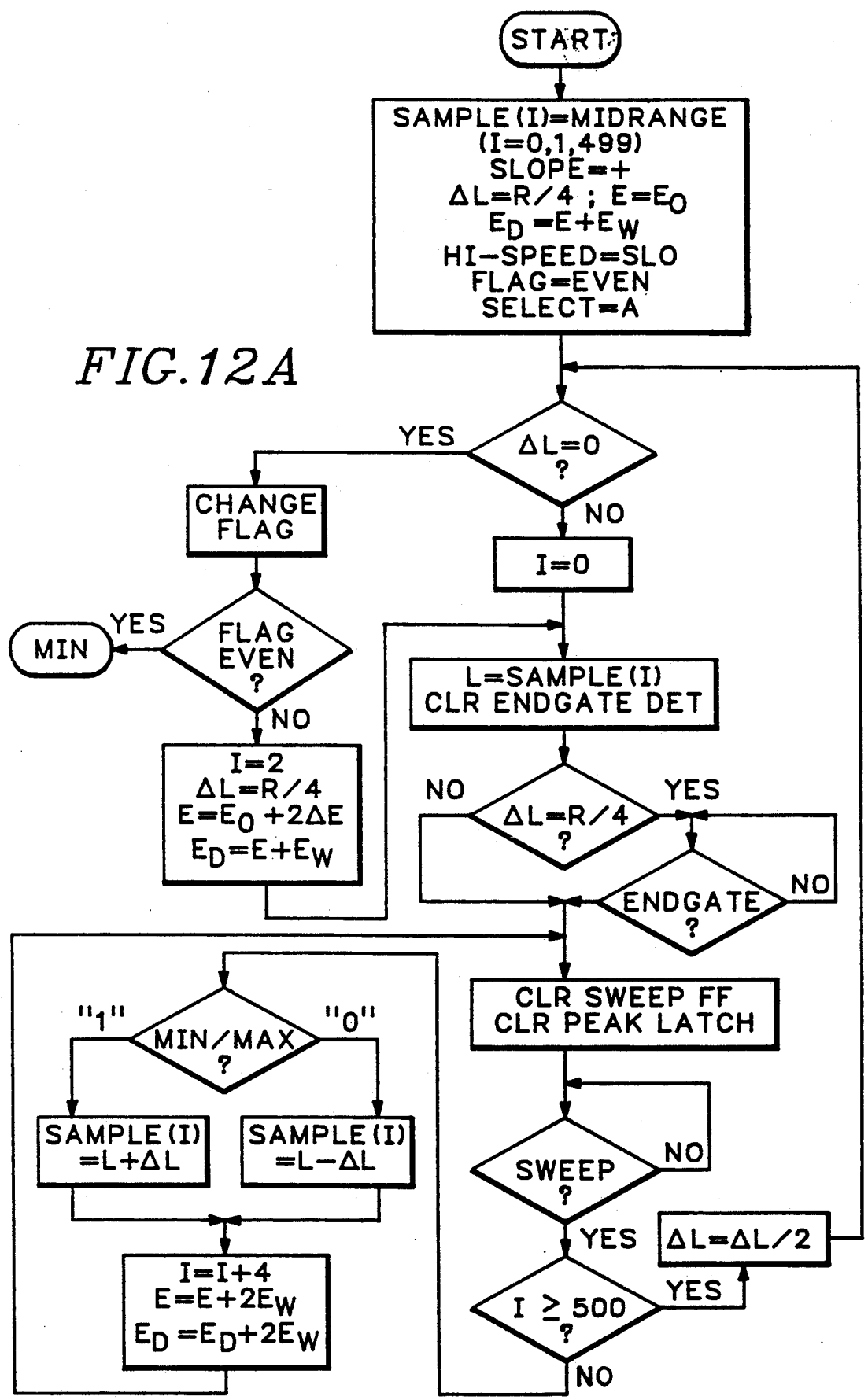
FIGS. 12A and 12B are a flow chart illustrating a second min/max measurement embodiment according to the present invention.
Figure 12B:
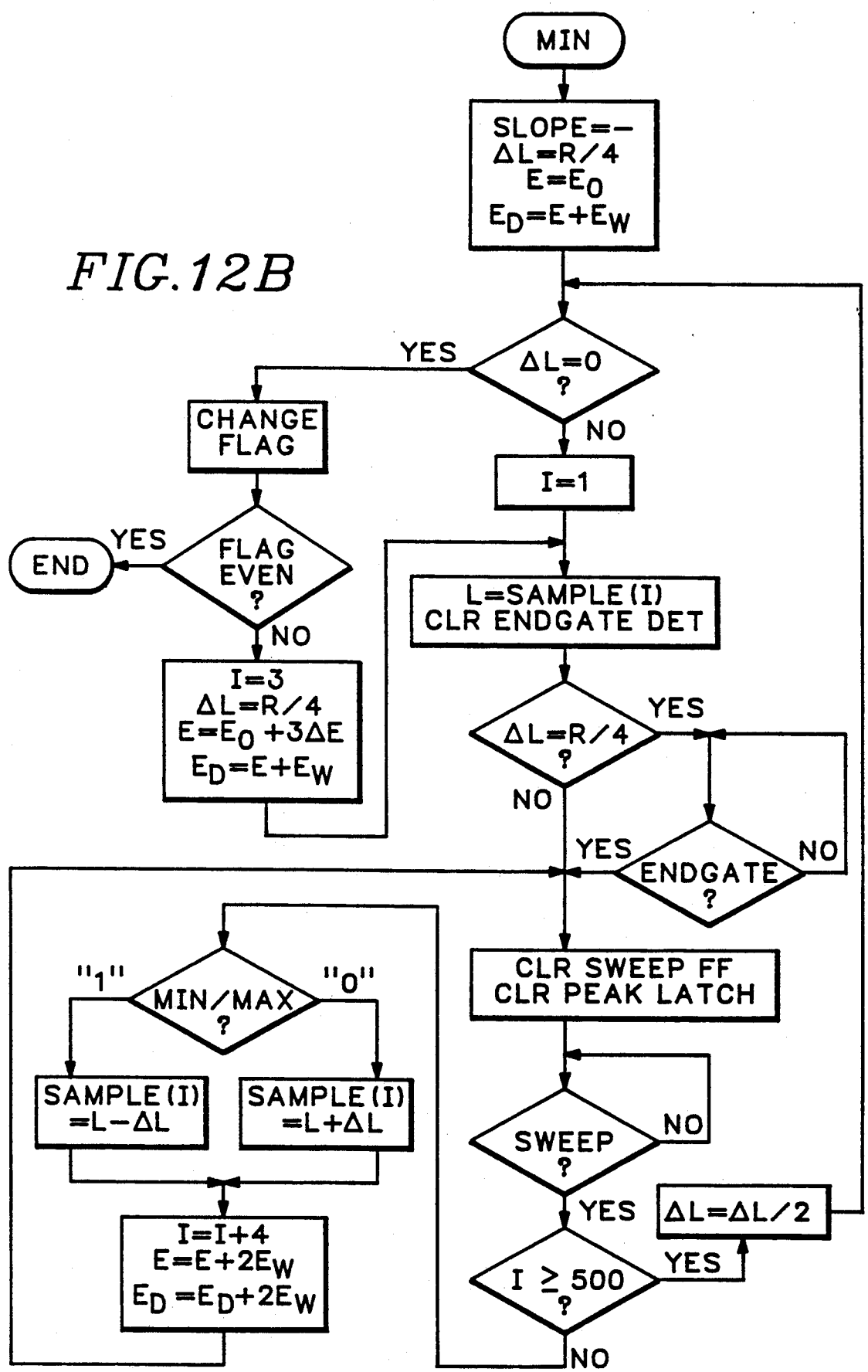
Figure 13A:
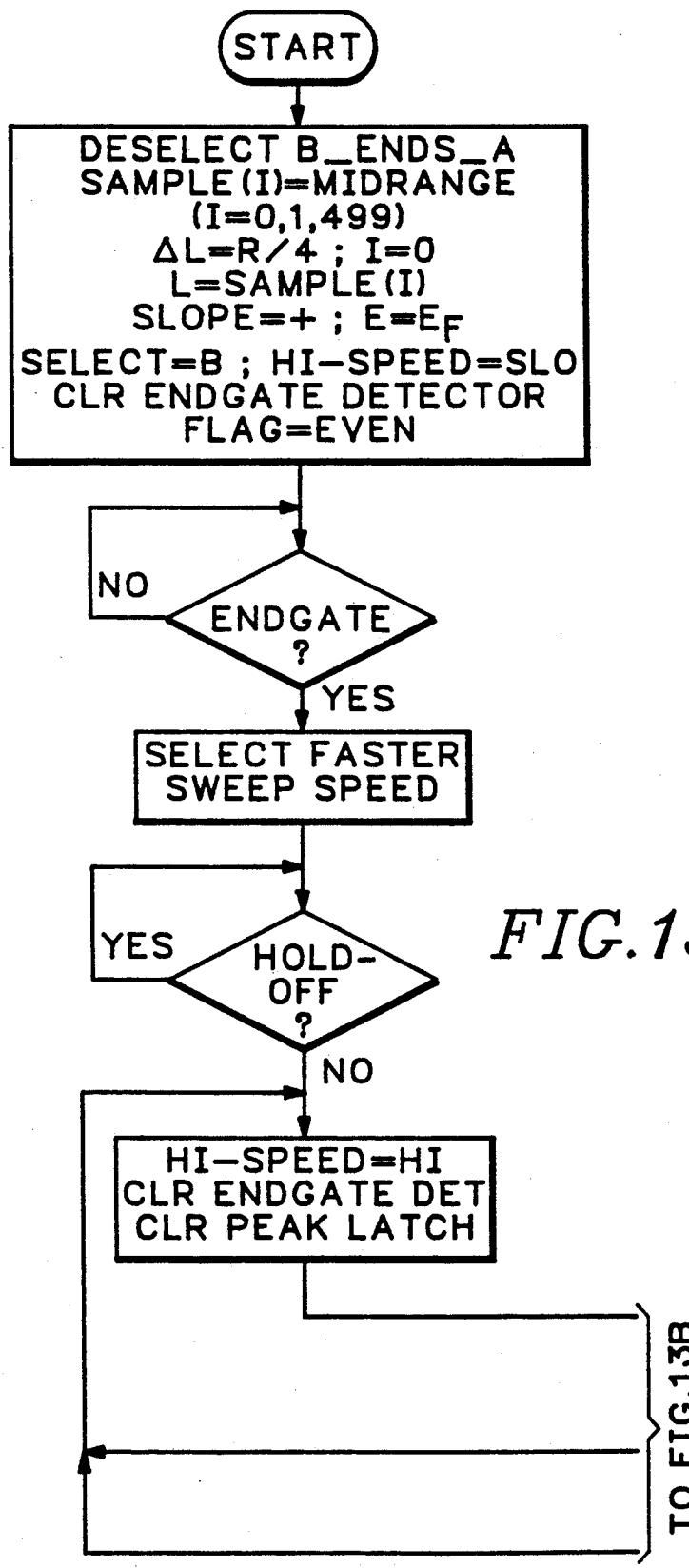
FIGS. 13A, 13B, 13C and 13D are a flow chart illustrating a third min/max measurement embodiment according to the present invention.
Figure 13B:
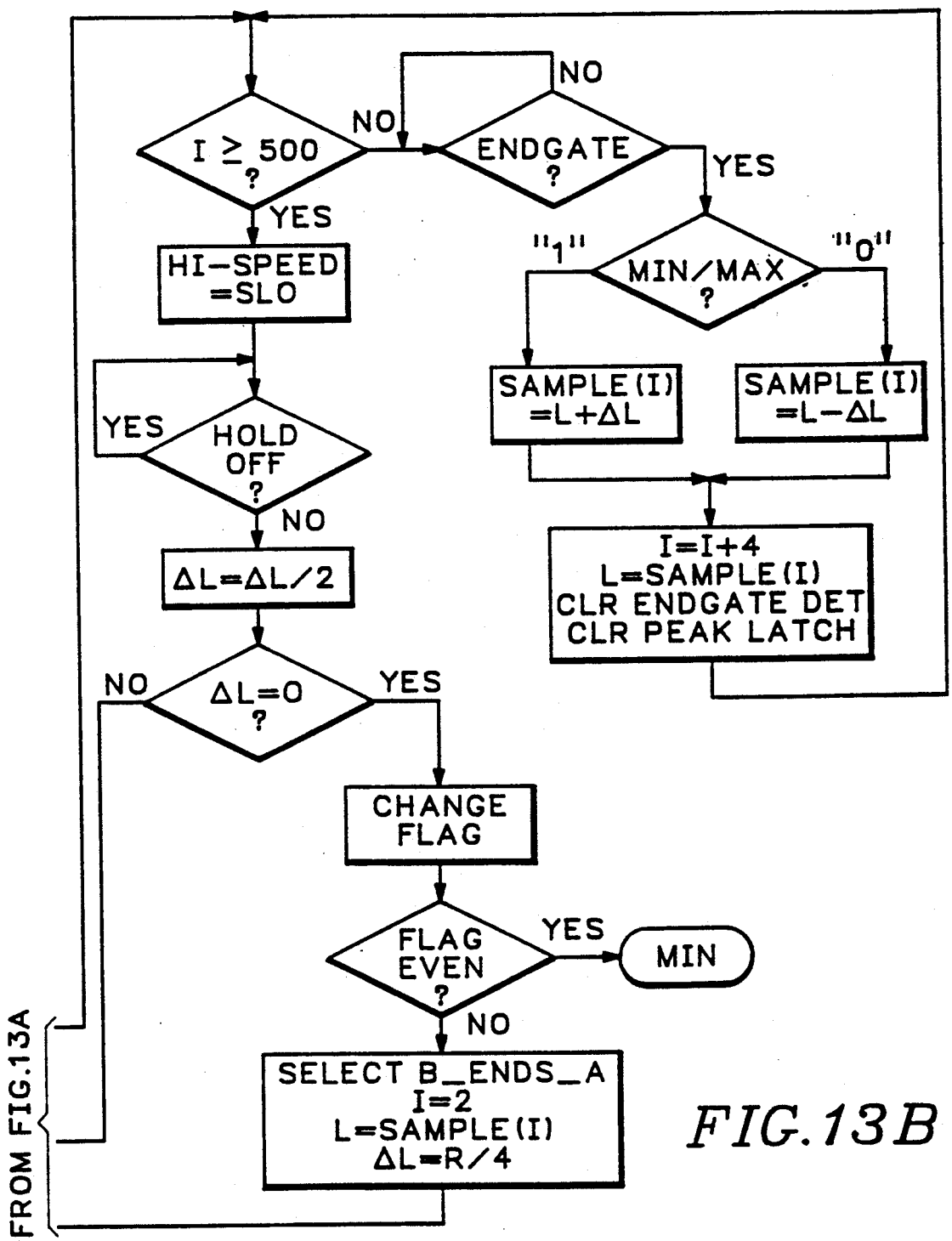
Figure 13C:
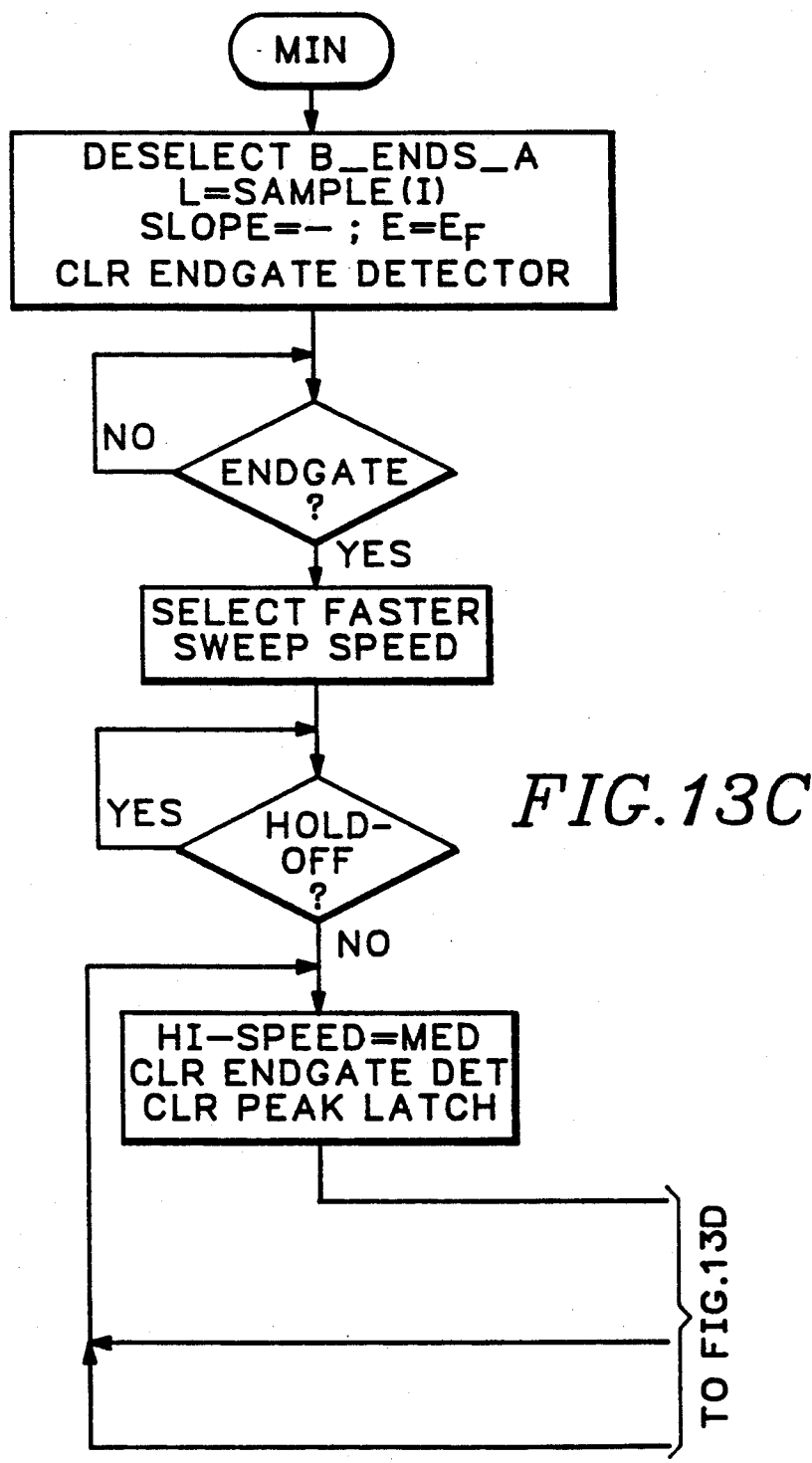
Figure 13D:
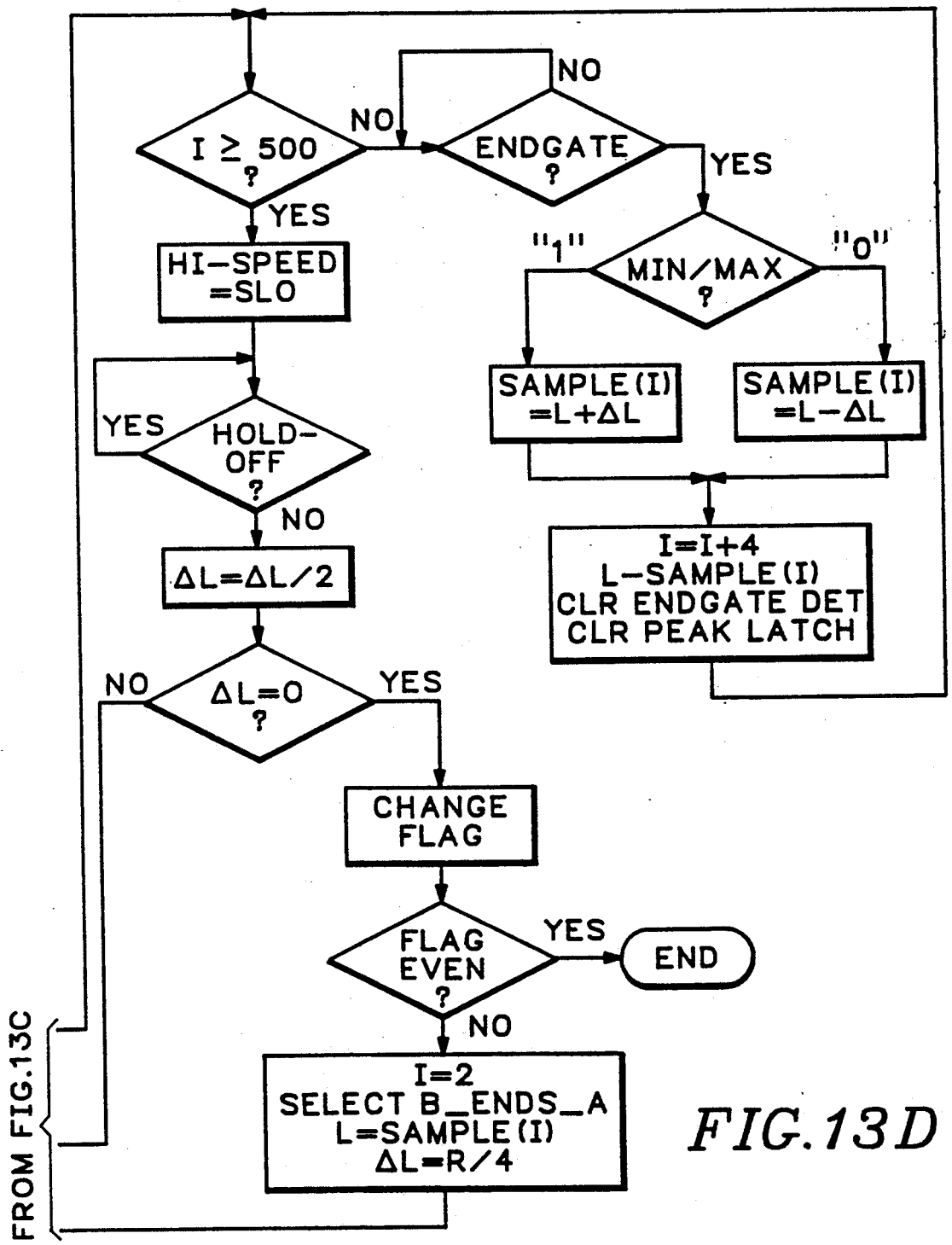

In mode two the intervals are sampled alternately, i.e., first the "even" intervals are sampled and then the "odd" intervals. As in mode one each interval is two sample intervals in duration, however since each interval is being sampled sequentially, there is a period between the completion of one interval and the start of the next that would not be sampled if the intervals were sampled in sequence. Therefore alternate intervals are sampled in one pass and the intervening intervals are sampled in a second pass. As shown in FIG. 12 a flag is set for even at the first pass. At the completion of the first pass the flag is changed and tested to determine if it is even. If the flag is odd, then the second pass is performed starting at I=2 rather than I=0. Otherwise two passes have been completed and the process is repeated for determining minimums by changing SLOPE to negative. As in the corresponding digitization mode the memory locations are initially set to the midrange, and then adjusted as each pass is performed until each maximum/minimum pair for each interval is completed.

Figure 14:
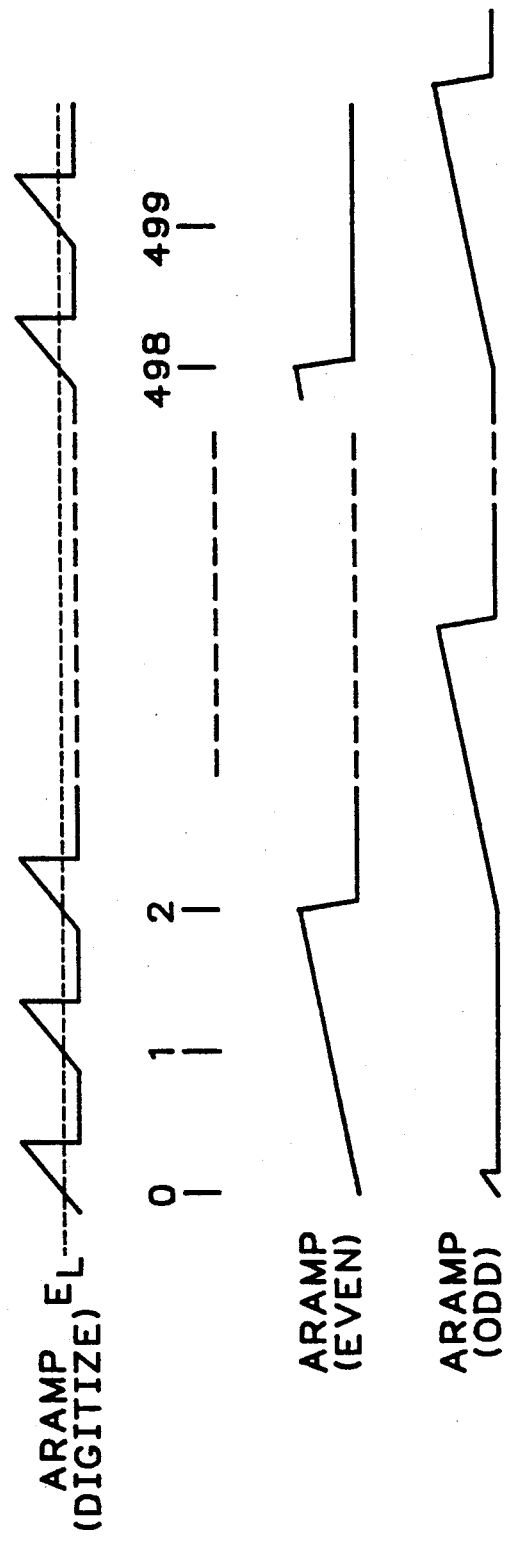
FIG. 14 is a timing diagram for the third min/max measurement embodiment of FIG. 13.

Finally the third mode, as shown in FIG. 13, initially determines the start point of A_TRIG and then switches to a free running medium-high speed mode, the frequency being one-quarter of the frequency required for digitizing in the third digitization mode described above. Except for the fact that it is the ARAMP signal that is repeating for each sample as opposed to the DELAY signal, the process is the same as for the second mode. Again the flag is set initially to even, and two passes are performed to obtain all the samples for maximum values. A_BENDS_A signal causes the ARAMP signal to be delayed by one-half a cycle, as shown in FIG. 14, for the second pass. The process is repeated to obtain the corresponding minimum values.

Figure 15:
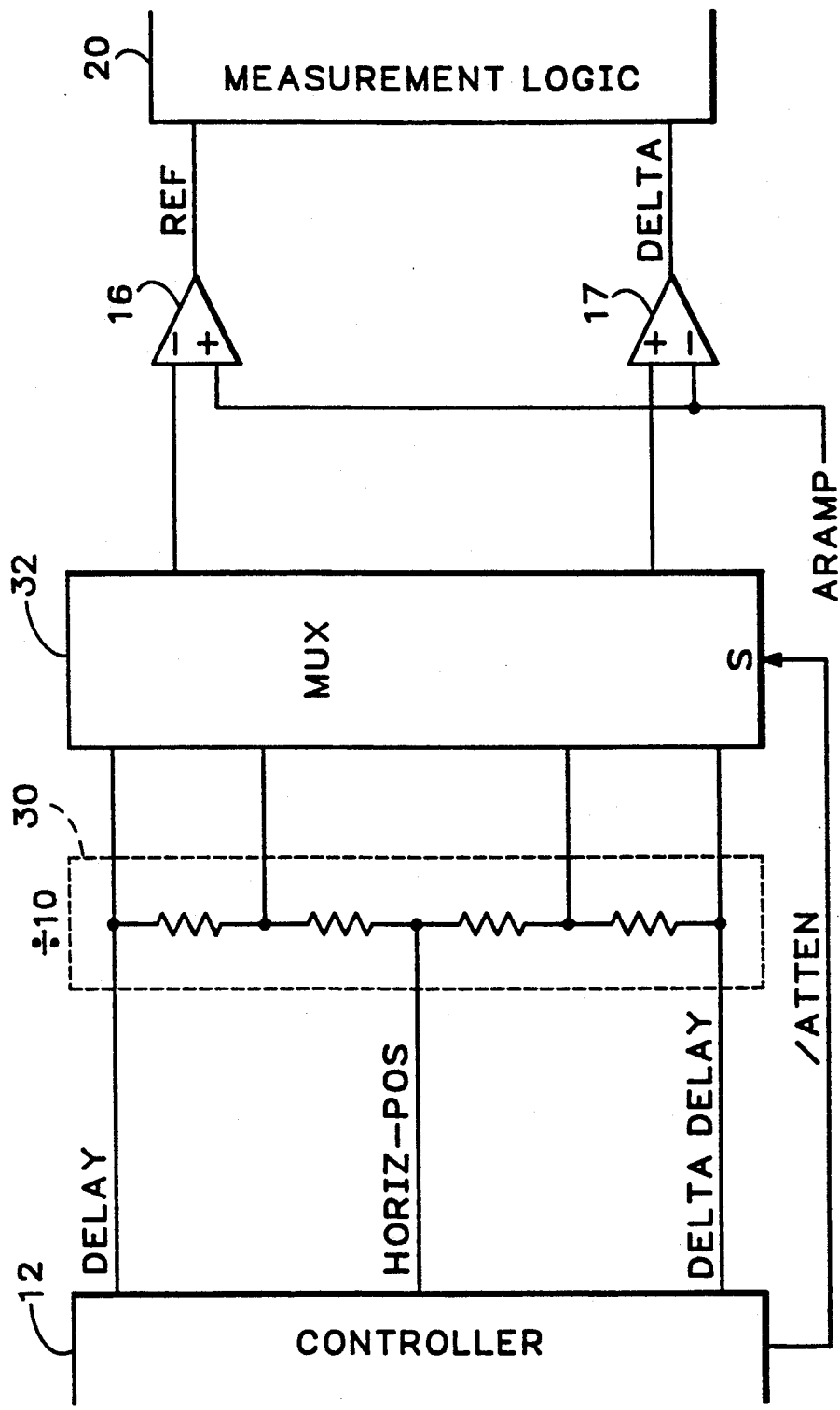
FIG. 15 is a partial block diagram of a modification of the block diagram of FIG. 1.

FIG. 15 shows a modification to the basic block diagram of FIG. 1 to maintain a resolution of 500 points per ten horizontal division according to the exemplary embodiment when in a magnified (×10) horizontal sweep mode. The DELAY signal and the DELTA DELAY signal from the controller 12 are input to an attenuator network 30. Also input to the attenuator network 30 is a horizontal position signal HORIZ_POS. The outputs from the attenuator network are the DELAY signal, an attenuated (×10) DELAY signal, the DELTA DELAY signal and an attenuated (×10) DELTA DELAY signal. These signals are input to a multiplexer 32 that selects either the attenuated or unattenuated versions of the DELAY and DELTA DELAY signals for input to the respective comparators 16, 17 according to an attenuator control signal /ATTEN from the controller 12. When the attenuated path is selected by the multiplexer 32, a horizontal digitizing range of one division is provided with respect to A_RAMP. This maintains the 500 point resolution. The offset level HORIZ_POS, applied to the reference terminal of the attenuator network 30, allows the DELAY and DELTA DELAY signals to be offset over the range of A_RAMP, analogous to the horizontal position control of the analog oscilloscope. As shown in FIG. 16 in the magnified mode HORIZ_POS from the controller 12 to the attenuator circuit 30 determines which horizontal division of the total of ten horizontal divisions of the display is selected, and the sampling of 500 points occurs during that interval. At the end of A_RAMP the HORIZ_POS signal returns to its zero state. Therefore during a period of one division at the beginning of the HORIZ_POS signal the waveform is sampled.

Thus the present invention provides a method of digitizing, including determining maxima/minima, an analog signal using an analog oscilloscope with a successive approximation technique by using a delay signal with a comparator to determine a point on the waveform in time, and adjusting a level signal on successive iterations for that point until the desired accuracy is achieved.

What is claimed is:

1. A method of digitizing a repetitive waveform using an analog oscilloscope comprising the steps of:
   a. initiating a ramp signal at a fixed point on the repetitive waveform at predetermined repetition intervals, the ramp signal being a horizontal sweep signal for the analog oscilloscope to display the repetitive waveform;
   b. selecting an attenuated version of a delay level to provide magnification of a selected portion of the repetitive waveform;
   c. for each iteration of the ramp signal comparing the ramp signal with the attenuated version of the delay level to generate a strobe signal, that attenuated version of the delay level representing a point to be digitized within the selected portion of the repetitive waveform;
   d. comparing the repetitive waveform with a digitizing level to generate a logic signal;
   e. sampling the logic signal with the strobe signal to generate a sample logic level;
   f. adjusting the digitizing level as a function of the sample logic level;
   g. repeating steps d.-f. until a predetermined condition is met;
   h. storing the digitized level as a digitized value in a storage location unique for the point;

i. incrementing the delay level by a predetermined amount to digitized a next point on the repetitive waveform; and j. repeating steps c.-i. until all points within the selected portion of the repetitive waveform are digitized.

2. A method of digitizing a repetitive waveform using an analog oscilloscope comprising the steps of:

a. initiating a ramp signal at a fixed point on the repetitive waveform, the ramp signal being a horizontal sweep sweep for the analog oscilliscope to display the repetitive waveform;

b. selecting an attenuated version of a delay level to provide magnification of a selected portion of the repetitive waveform;

c. comparing the ramp signal with the delay level representing a point on the waveform to be digitized to generate a strobe signal;

d. comparing the repetitive waveform with a digitizing level from a storage location corresponding to the point to generate a logic signal;

e. sampling the logic signal with the strobe signal to generate a sample logic level;

f. adjusting the digitizing level as a function of the sample logic level and storing the adjusted digitizing level in the storage location;

g. incrementing the delay level for a next point on the waveform;

h. repeating steps b.-f. until all points in the selected portion of the repetitive waveform are sampled during one iteration of the ramp signal; and i. repeating steps b.-g. until a predetermined condition is achieved for each point, indicating that digitization of the repetitive waveform is complete.

3. A method of digitizing a repetitive waveform using an analog oscilloscope comprising the steps of:

a. detecting a fixed initial point on the repetitive waveform at predetermined intervals;

b. generating a free-running, fast ramp signal starting at the fixed initial point, the number of iterations of the fast ramp signal per predetermined interval being a function of the number of points on the repetitive waveform to be digitized during each predetermined interval;

c. selecting an attenuated version of a delay level to provide magnification of a selected portion of the repetitive waveform;

d. comparing the fast ramp signal with a fixed delay level to generate a strobe pulse for each point;

e. comparing the repetitive waveform with a digitizing level from a storage location for each point being digitized to generate a logic signal;

f. sampling the logic signal for each point with the strobe pulse for each point to generate sample logic levels for each point;

g. adjusting the digitizing level for each point as a function of the sample logic level for each point;

h. storing the digitizing level for each point in the storage location for each point; and i. repeating steps b.-h. until a predetermined condition is achieved indicating that the digitization of the repetitive waveform is complete.

4. A method of determining maxima and minima for a repetitive waveform using an analog oscilloscope comprising the steps of:

a. initiating a ramp signal at a fixed point on the repetitive waveform at predetermined repetition intervals, the ramp signal being a horizontal sweep signal for the analog oscilloscope to display the repetitive waveform;

b. for each iteration of the ramp signal generating a window interval as a function of the ramp signal, a delay level and a delta level;

c. comparing the repetitive waveform with a digitizing level to generate a logic signal;

d. sampling the logic signal during the window interval to generate a sample logic signal;

e. adjusting the digitizing level as a function of the sample logic signal;

f. repeating steps c.-e. until a predetermined condition is met;

g. storing the digitizing level as a maximum in a storage location for the window interval;

h. incrementing the delay and delta levels to generate a next window interval;

i. repeating steps b.-h. until maxima are determined for all window intervals covering the repetitive waveform; and j. repeating steps b.-i. with the polarity of the repetitive waveform comparing step reversed to determine a minimum for each window interval for which the maximum is determined.

5. A method as recited in claim 4 further comprising the step of selecting an attenuated version of the delay level and the delta level to provide magnification of a selected portion of the repetitive waveform.

6. A method of determining maxima and minima for a repetitive waveform using an analog oscilloscope comprising the steps of:

initiating a ramp signal at a fixed point on the repetitive waveform at predetermined repetition intervals, the ramp signal being a horizontal sweep signal for the analog oscilloscope to display the repetitive waveform;

b. generating a window interval as a function of the ramp signal, a delay level and a delta level;

c. comparing the repetitive waveform with a digitizing level from a storage location corresponding to the window interval to generate a logic signal;

d. sampling the logic signal during the window interval to generate a sample logic signal;

e. adjusting the digitizing level as a function of the sample logic signal and storing the adjusted digitizing level in the storage location;

f. incrementing the delay and delta levels for a next window interval for the waveform;

g. repeating steps b.-f. until all points on the repetitive waveform during one iteration of the ramp signal ar sampled;

h. repeating steps b.-g. until a predetermined condition is achieved, indicating that maxima for all window intervals of the repetitive waveform are complete; and i. repeating steps b.-h. with the polarity of the repetitive waveform comparing step reversed to obtain minima for all the window intervals of the repetitive waveform.

7. A method as recited in claim 6 further comprising the step of selecting an attenuated version of the delay level and the delta level to provide magnification of a selected portion of the repetitive waveform.

8. A method of determining maxima and minima over segments of a repetitive waveform comprising the steps of:

a. detecting a fixed initial point on the repetitive waveform at predetermined intervals;

b. generating a free-running, gate signal starting at the fixed initial point, the number of iterations of the gate signal per predetermined interval being a function of the number of segments of the repetitive waveform for which maxima and minima are to be determined for each predetermined interval;

c. comparing the repetitive waveform with a digitizing level from a storage location for each segment to generate a logic signal;

d. sampling the logic signal for each segment during the gate signal to generate sample logic signals for each segment;

e. adjusting the digitizing level for each segment as a function of the sample logic signal for each segment;

f. storing the digitizing level for each segment in the storage location for that segment;

g. repeating steps b.–f. until a predetermined condition is achieved indicating that the maxima for the waveform are complete; and h. repeating steps b.–g. with the polarity of the repetitive waveform comparing step reversed to obtain the minima corresponding to the maxima for the waveform.

9. A method as recited in claim 8 further comprising the step of selecting an attenuated version of the delay level and the delta level to provide magnficiation of a selected portion of the repetitive waveform.

10. An apparatus for digitizing a repetitive waveform using an analog oscilloscope comprising:
   means for generating a ramp signal starting at an initial point on the repetitive waveform, the ramp signal being a horizontal sweep signal for the analog oscilloscope to display the repetitive waveform;
   means for comparing the ramp signal with a programmable delay level to generate a strobe signal, the programmable delay level to generate a strobe signal, the programmable delay level identifying a sample point on the repetitive waveform;
   means for selecting an attenuated version of the programmable delay level to provide magnification of a selected portion of the repetitive waveform;
   means for adjusting the programmable delay level in n increments per ramp signal corresponding to n sample points within the selected portion of the repetitive waveform so that the strobe signal has a pulse for each sample point during the ramp signal;
   means for each sample point for comparing the repetitive waveform with a digitizing level from a storage location, each sample point having a unique storage location, to generate a logic signal for each sample point;
   means for sampling the logic signal for each sample point with the strobe signal to generate a sample logic level for each point;
   means for adjusting the digitizing level for each sample point as a function of the corresponding sample logic level once per ramp signal cycle;
   means for storing the digitizing level for each sample point in the corresponding storage location; and
   means for determining that digitization of the repetitive waveform is complete after a predetermined condition is achieved.

11. An apparatus for digitizing a repetitive waveform comprising:
   means for generating a free-running ramp signal starting from an initial point on the repetitive waveform, the fast ramp signal having n cycles during a predetermined interval, n being the number of sample points of the repetitive waveform;
   means for selecting an attenuated version a delay level to provide magnification of a selected portion of the repetitive waveform;
   means for generating a strobe signal from the fast ramp signal by comparing the free-running, fast-ramp signal with the delay level, the strobe signal having a pulse for each sample point;
   means for comparing the repetitive waveform with a programmable digitizing level for each sample point from respective storage locations to generate a logic signal for each sample point;
   means for sampling the logic signal for each sample point with the strobe pulse for each point to generate sample logic levels for each point;
   means for adjusting the programmable digitizing level for each sample point as a function of the corresponding sample logic level;
   means for determining when a predetermined condition is achieved indicating that the digitization of the repetitive waveform is complete.

12. An apparatus for determining maxima and minima for segments of a repetitive waveform comprising:
   means for generating a window signal for each segment;
   means for comparing the repetitive waveform with a programmable digitizing level to generate a logic signal;
   means for sampling the logic signal during the window signal to generate a sample logic signal;
   means for adjusting the programmable digitizing level as a function of the sample logic signal;
   means for determining when a predetermined condition is achieved indicating that the maximum/minimum for the window interval is complete;
   means for determining whether the programmable digitizing level is a maximum value or a minimum value;
   means for storing the programmable digitizing level in an appropriate storage location corresponding to the window interval and whether the programmable digitizing level is the maximum or minimum value for the window interval; and
   means for moving the window interval so that the maximum/minimum for each segment is determined.

13. An apparatus as recited in claim 11 further comprising means for selecting an attenuated version of the window signal to provide magnification of a selected portion of the repetitive waveform.

14. An apparatus for determining the maxima and minima for segments of a repetitive waveform comprising:
   means for generating a plurality of window intervals starting from an initial point on the repetitive waveform;
   means for comparing the repetitive waveform with a programmable digitizing level for each window interval from corresponding storage locations to generate a logic signal for each window interval;
   means for sampling the logic signal for each window interval to generate a sample logic signal for each window interval;
   means for adjusting the programmable digitizing level for each window interval as a function of the corresponding sample logic signal;

means for determining when a predetermined condition is achieved indicating that the maxima and minima are completed; and means for storing the maxima and minima in the appropriate storage locations corresponding to the segments.

15. An apparatus as recited in claim 14 further comprising means for selecting an attenuated version of the window signal to provide magnification of a selected portion of the repetitive waveform.

* * * * *